United States Patent
Lee et al.

(10) Patent No.: US 7,359,240 B2
(45) Date of Patent: Apr. 15, 2008

(54) FLASH MEMORY DEVICE WITH MULTI LEVEL CELL AND BURST ACCESS METHOD THEREIN

(75) Inventors: Jung-Woo Lee, Gyeonggi-do (KR); Jae-Yong Jeong, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 159 days.

(21) Appl. No.: 11/322,983

(22) Filed: Dec. 29, 2005

(65) Prior Publication Data
US 2007/0016722 A1  Jan. 18, 2007

(30) Foreign Application Priority Data
Jun. 24, 2005  (KR) .................. 10-2005-0055225

(51) Int. Cl.
*G11C 11/34* (2006.01)
(52) U.S. Cl. .................... 365/185.03; 365/185.13; 365/185.23
(58) Field of Classification Search .......... 365/185.03, 365/185.13, 185.23, 239, 185.25, 189.08
See application file for complete search history.

(56) References Cited

U.S. PATENT DOCUMENTS 7,164,602 B2 * 1/2007 Hamamoto et al. .... 365/185.09

2006/0087893 A1 * 4/2006 Nishihara et al. ...... 365/189.01

FOREIGN PATENT DOCUMENTS

| JP | 08-315586 | 11/1996 |
| JP | 10-233096 | 9/1998 |
| KR | 2005-0007653 | 1/2005 |

OTHER PUBLICATIONS

English language abstract of Korean Publication No. 2005-0007653.
English language abstract of Japanese Publication No. 08-315586.
English language abstract of Japanese Publication No. 10-233096.

* cited by examiner

*Primary Examiner*—Anh Phung
*Assistant Examiner*—Dang Nguyen
(74) *Attorney, Agent, or Firm*—Marger Johnson & McCollom, P.C.

(57) ABSTRACT

A flash memory device including memory cells, each memory cell configured to store bits, a sensing circuit configured to sequentially sense, for each memory cell, sets of the bits of the memory cell, a data rearrangement unit configured to receive words of data and to rearrange bits of the words to be stored in the memory cells, and an output circuit configured to output a group of the words using the sets of bits from one sensing, at least as early as during a subsequent sensing of sets of bits.

9 Claims, 8 Drawing Sheets

Fig. 2B

| Physical Address | Cell | 0 | | 1 | | 2 | | 3 | | 4 | | 5 | | 6 | | 7 | |
|---|---|---|---|---|---|---|---|---|---|---|---|---|---|---|---|---|---|
| | I/O | MSB | LSB | MSB | LSB | MSB | LSB | MSB | LSB | MSB | LSB | MSB | LSB | MSB | LSB | MSB | LSB |
| #0 | Logical Address | 1 | 0 | 3 | 2 | 5 | 4 | 7 | 6 | 9 | 8 | 11 | 10 | 13 | 12 | 15 | 14 |
| #1 | Logical Address | N | N | N | N | N | N | N | N | N | N | N | N | N | N | N | N |
| #1 | Logical Address | 1 | 0 | 3 | 2 | 5 | 4 | 7 | 6 | 9 | 8 | 11 | 10 | 13 | 12 | 15 | 14 |
| #2 | Logical Address | N+1 | N+1 | N+1 | N+1 | N+1 | N+1 | N+1 | N+1 | N+1 | N+1 | N+1 | N+1 | N+1 | N+1 | N+1 | N+1 |
| #2 | Logical Address | N+2 | N+2 | N+2 | N+2 | N+2 | N+2 | N+2 | N+2 | N+2 | N+2 | N+2 | N+2 | N+2 | N+2 | N+2 | N+2 |
| #3 | Logical Address | N+3 | N+3 | N+3 | N+3 | N+3 | N+3 | N+3 | N+3 | N+3 | N+3 | N+3 | N+3 | N+3 | N+3 | N+3 | N+3 |

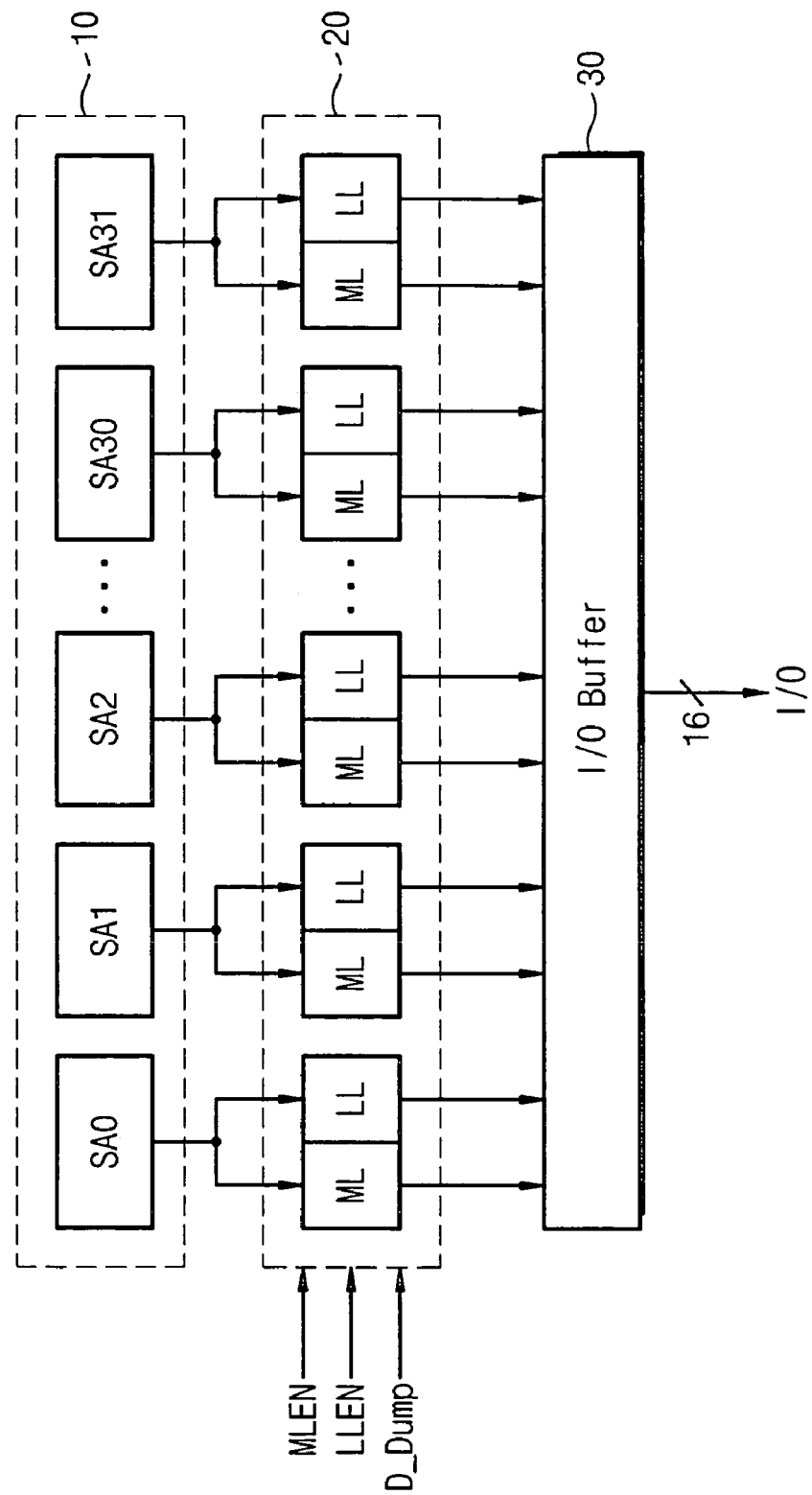

Fig. 7

| Physical Address | Cell \ I/O | 0 MSB | 0 LSB | 1 MSB | 1 LSB | 2 MSB | 2 LSB | 3 MSB | 3 LSB | 4 MSB | 4 LSB | 5 MSB | 5 LSB | 6 MSB | 6 LSB | 7 MSB | 7 LSB |
|---|---|---|---|---|---|---|---|---|---|---|---|---|---|---|---|---|---|
| #0 | I/O | 0 | 0 | 1 | 1 | 2 | 2 | 3 | 3 | 4 | 4 | 5 | 5 | 6 | 6 | 7 | 7 |
|  | Logical Address | N | N+2 | N | N+2 | N | N+2 | N | N+2 | N | N+2 | N | N+2 | N | N+2 | N | N+2 |
| #1 | I/O | 8 | 8 | 9 | 9 | 10 | 10 | 11 | 11 | 12 | 12 | 13 | 13 | 14 | 14 | 15 | 15 |
|  | Logical Address | N | N+2 | N | N+2 | N | N+2 | N | N+2 | N | N+2 | N | N+2 | N | N+2 | N | N+2 |
| #2 | I/O | 0 | 0 | 1 | 1 | 2 | 2 | 3 | 3 | 4 | 4 | 5 | 5 | 6 | 6 | 7 | 7 |
|  | Logical Address | N+1 | N+3 | N+1 | N+3 | N+1 | N+3 | N+1 | N+3 | N+1 | N+3 | N+1 | N+3 | N+1 | N+3 | N+1 | N+3 |
| #3 | I/O | 8 | 8 | 9 | 9 | 10 | 10 | 11 | 11 | 12 | 12 | 13 | 13 | 14 | 14 | 15 | 15 |
|  | Logical Address | N+1 | N+3 | N+1 | N+3 | N+1 | N+3 | N+1 | N+3 | N+1 | N+3 | N+1 | N+3 | N+1 | N+3 | N+1 | N+3 |

(12)  United States Patent

FLASH MEMORY DEVICE WITH MULTI LEVEL CELL AND BURST ACCESS METHOD THEREIN

CROSS-REFERENCE TO RELATED APPLICATIONS

This U.S. non-provisional patent application claims priority under 35 U.S.C. § 119 of Korean Patent Application 2005-55225 filed on Jun. 24, 2005, the entire contents of which are hereby incorporated by reference.

BACKGROUND OF THE INVENTION

1. Field of the Invention

This disclosure relates to a semiconductor memory device, and more particularly, to a flash memory device with a multi level cell and a burst access method.

2. Description of the Related Art

A flash memory device is a nonvolatile semiconductor memory device that can electrically perform program and erase operations. In applications of a mass storage or a coded memory in a mobile device, a high capacity or high speed characteristic is increasingly required. Thus, flash memory devices are widely used. Flash memory devices can be classified into NAND flash memory and NOR flash memory. A cell array of the NOR flash memory has of memory cells arranged in parallel with respect to one bit line, while a cell array of the NAND flash memory has a plurality of memory cells arranged in series with respect to one bit line. The NOR flash memory has much higher speed in program and read operations than the NAND flash memory. Therefore, the NOR flash memory is widely used in fields that demand a high speed characteristic. The NOR flash memory, however, is very disadvantageous in terms of the degree of integration, using more chip area than other flash memory types As one of approaches to solving the limitation of the storage capacity, a multi level cell (MLC) scheme has been adopted. The MLC overcomes the limitation of a physical integration by storing multiple bits in one memory cell.

Hereinafter, terms that will be used in the detailed description of the invention will be summarized in brief.

A most significant bit (MSB) indicates data that is detected from an MLC, to which a serial sensing is applied, through a first sensing. That is, the MSB does not mean a general MSB of a digital data. A least significant bit (LSB) indicates data that is detected from an MLC, to which a serial sensing is applied, through a second sensing.

A physical address means a unit address of a cell of a memory cell, in which data is stored. A logical address is an address assigned from an outside and is not related to a memory cell arrangement.

Also, a 2-bit cell that can store 2 bits (MSB, LSB) per cell will be taken as an example. When a burst length (BL)=4/1 word=16 bits, the prior art and embodiments of the present invention will be described.

FIG. 1 illustrates a method of reading data from a 2-level cell by using a serial sensing. A parallel sensing scheme or a serial sensing scheme can be used for reading data from an MLC. The parallel sensing scheme reads a stored 2-bit data by one-time sensing, and the serial sensing scheme reads data an MSB and an LSB in sequence. A following description will be made only about a memory device using the serial sensing. Referring to FIG. 1, the serial sensing of an MLC includes a first sensing and a second sensing. The first sensing is to detect an ON/OFF-state of a cell by using a verification voltage VM so as to detect an MSB. After the MSB data is detected through the first sensing, positions of verification voltages VL1 and VL2 of the second sensing for detecting an LSB are determined by referring to the MSB data. That is, when the MSB data detected in the first sensing is "1", a left verification voltage VL1 is selected as the verification voltage of the second sensing. On the contrary, when the detected MSB data is "0", a right verification voltage VL2 is selected as the verification voltage of the second sensing. The 2-bit data stored in the cell is read through these successive serial sensing operations.

FIG. 2A is a block diagram illustrating a method of programming an input data read by the serial sensing in a memory device with MLCs. Referring to FIG. 2A, a plurality of external word-based data are stored in cells corresponding to physical addresses that are assigned inside in units of one word. One physical address designates MLCs for programming one complete word-based data. Specifically, when word-length data having one logical address is programmed in the cells, the data is programmed in the cells constituting one physical address. If a 16-bit length word N is inputted, all bit values of the word N are programmed in MSBs and LSBs of eight cells constituting a physical address #0. The above method is equally applied to a plurality of consecutive input words constituting one burst length. The consecutive words N+1, N+2 and N+3 followed by the word N are programmed in MSBs and LSBs of eight cells contained in a corresponding physical address. One word data having one logical address is all programmed in eight cells corresponding to one physical address.

FIG. 2B is a memory map for explaining the programmed result when the input data of one burst length are programmed in the corresponding memory cells. Referring to FIG. 2B, four 16-bit input words N, N+1, N+2 and N+3 are programmed in the corresponding eight MLCs constituting the physical addresses #0, #1, #2 and #3 of the memory cells. One input word is programmed in the cells constituting one physical address. Accordingly, one input word is stored in the bits of the cells of one physical address.

FIG. 3 is a block diagram of a configuration for reading data programmed by the method of FIG. 2. Referring to FIG. 3, sense amplifiers 10 sense data of a designated burst length from cells. A latch circuit 20 latches logic values sensed by the sense amplifier 10 in response to an MSB latch enable signal MLEN and an LSB latch enable signal LLEN, and outputs the latched data in response to a data dump signal D_Dump. An I/O buffer 30 outputs the word-based data, which are outputted from the latch circuit 20, to the outside in synchronization with a clock.

The number of the sense amplifiers 10 is equal to the number of cells storing one burst-length of data with the bits in the cell serially sensed. Thus, to detect all bit values of one designated burst length (for example, 64 bits for BL=4/16 bits=1 word) requires two sensing operations, that is, a first sensing for detecting an MSB and a second sensing for detecting an LSB.

The latch circuit 20 stores the detected data outputted through the serial sensing of the sense amplifier 10. Specifically, MSB bits of the respective cells, which are detected through the first sensing, are stored in the MSB latches allocated in each cell in response to the MLEN signal. Thereafter, when the LSB data of the respective cells are detected by the sense amplifier 10 through the second sensing, the detected LSB data are stored in the LSB latches allocated in each cell in response to the LLEN signal. Through these procedures, data corresponding to one burst length are stored in all latches of the latch circuit 20. Then, the outputs of the respective latches are activated in response to the D_Dump signal and are outputted in units of a word (I/O unit). In FIG. 3, all data of the latches corresponding to the sense amplifiers SA0 to SA7 are outputted in response to a first clock, and all data of the latches corresponding to the sense amplifiers SA8 to SA15 are outputted in response to a second clock. All data of the latches corresponding to the sense amplifiers SA16 to SA23 are outputted in response to a third clock, and all data of the latches corresponding to the sense amplifiers SA24 to SA31 are outputted in response to a fourth clock. In terms of the I/O data of the I/O buffer, bits stored in the MSB and bits stored in the LSB constitute an odd I/O and an even I/O, respectively. The D_Dump signal activates the outputs of the above-described latches, such that all latched bits corresponding to one burst length are sequentially outputted in units of words. The D_Dump signal is outputted from an internal counter and is combined in the word equal to the logical address when the outputs of the latches activated in each clock are inputted.

The I/O buffer 30 outputs the word-based output data of the latch circuit 20 in synchronization with the clock. The word stored in one physical address constitutes one I/O.

It can be seen that the conventional burst reading has to be outputted after the MSB and LSB data are all latched from the memory cell array.

FIG. 4 is a timing diagram for explaining the burst reading operation performed by the data programming method of FIG. 2 and the read path of FIG. 3. The conventional burst reading operation of the MLC memory will be described below with reference to FIG. 4.

Referring to FIG. 4, when an address detection signal nAVD indicating that the input address is valid is inputted, the MSB data of the cells are detected by the sense amplifiers 10 during the first sensing period of two clocks. At the latter part of the first sensing, when the MLEN signal is inputted such that the detected MSB data can be stored in the corresponding MSB latch, the data are prefetched by the sense amplifiers and then are latched. Then, based on the MSB data, the LSB data are detected for two clocks through the second sensing. Likewise, at the latter part of the detection, all LSB data of the cells are prefetched by the sense amplifier 10 and the latch circuit 20 latches them in synchronization with the LLEN signal. For four clocks, all data bits constituting one designated burst length are latched. Thereafter, when the D_Dump signal is inputted to the latch circuit 20, the latched data are combined in units of the words N, N+1, N+2 and N+3, and then are sequentially outputted. From the data output of FIG. 4, it can be seen that all MSBs and LSBs of the respective cells are outputted in units of words only after they are latched by the first sensing and the second sensing. The reason for this is that one word unit can constitute the complete I/O and be simultaneously outputted only when the latched bits of the MSBs and LSBs are combined, and both the MSB and the LSB has to be sensed so as to constitute one I/O. In other words, although the MSB and LSB of one cell constitute data bits of the identical I/O word unit in the output operation, the data of the word unit are always outputted after the first sensing and the second sensing are completed, because the MSB and the LSB cannot be simultaneously sensed in the serial sensing.

SUMMARY OF THE INVENTION

An embodiment includes a flash memory device including memory cells, each memory cell configured to store bits, a sensing circuit configured to sequentially sense, for each memory cell, sets of the bits of the memory cell, a data rearrangement unit configured to receive words of data and to rearrange bits of the words to be stored in the memory cells, and an output circuit configured to output a group of the words using the sets of bits from one sensing, at least as early as during a subsequent sensing of sets of bits.

Another embodiment includes a method of programming a flash memory device including receiving a plurality of words of data, mapping a first set of the words of data to first sets of bits of multi level memory cells, each multi level memory cell having multiple sets of bits, each set to be sensed sequentially, the first sets of bits to be sensed in a first sensing of the multi level memory cells, mapping a subsequent set of the words of data to subsequent sets of the bits of the multi level memory cells, the subsequent sets of the bits to be sensed in a subsequent sensing of the multi level memory cells, and storing the mapped sets of words in the multi level memory cells.

A further embodiment includes a method of reading a flash memory device including sensing first sets of bits stored in multi level memory cells, each multi level memory cell having multiple sets of bits, each set to be sensed sequentially, the first sets of the bits to be sensed in a first sensing of the multi level memory cells, and outputting words of data using the first sets of bits at least as early as during a subsequent sensing of subsequent sets of bits of the multi level memory cells.

BRIEF DESCRIPTION OF THE DRAWINGS

The accompanying drawings, which are included to provide a further understanding of the invention illustrate embodiment(s) of the invention and together with the description serve to explain the principle of the invention. In the drawings:

FIG. 2B is a memory map for explaining the programmed result when the input data of one burst length are programmed in the corresponding memory cells;

FIG. 3 is a block diagram of a conventional serial sensing scheme;

FIG. 7 is a memory map of one burst data programmed in a memory cell according to an embodiment.

DETAILED DESCRIPTION OF THE INVENTION

Reference will now be made in detail to preferred embodiments, examples of which are illustrated in the accompanying drawings. However, the invention is not limited to the embodiments illustrated hereinafter. Rather, the embodiments herein are introduced to provide easy and complete understanding of the scope and spirit of the invention.

Figure 1:
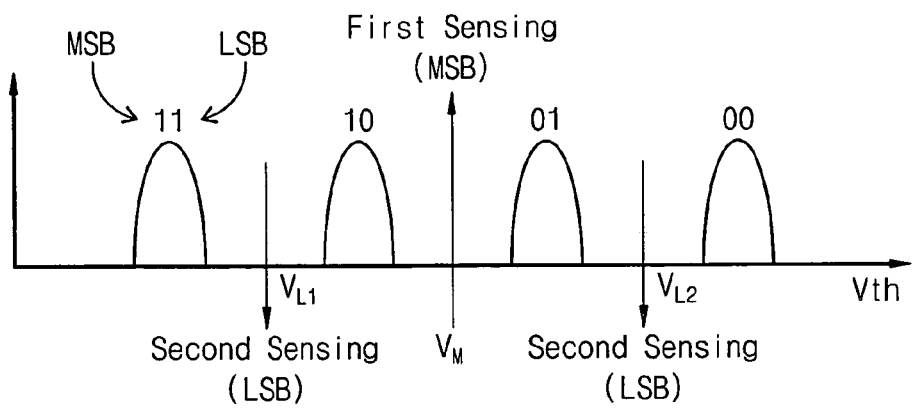
FIG. 1 illustrates a conventional serial sensing scheme.
Figure 2A:
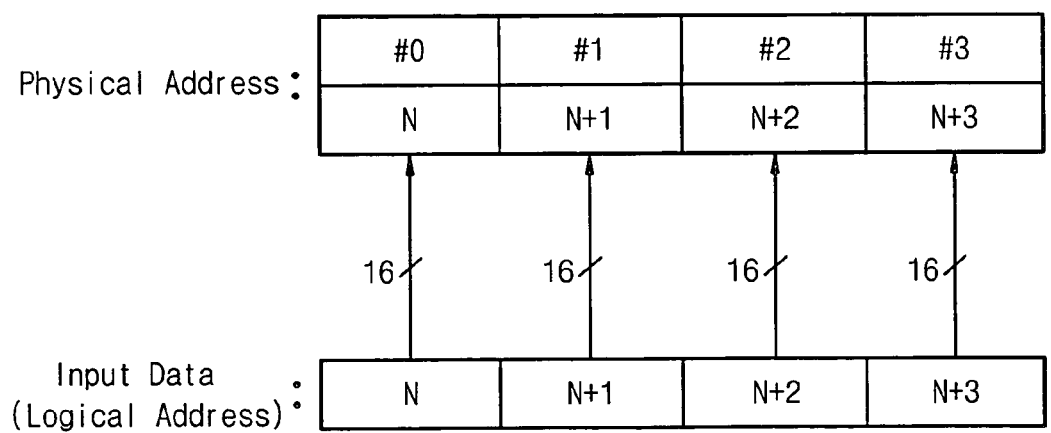
FIG. 2A is a block diagram illustrating a method of programming data in a conventional MLC.
Figure 4:
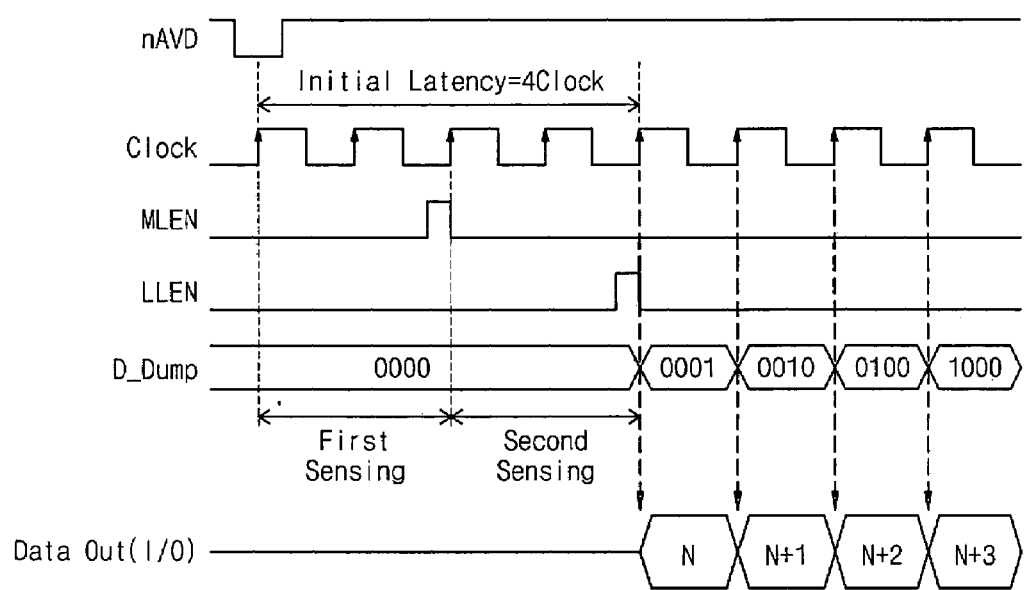
FIG. 4 is a timing diagram of a conventional serial sensing scheme.
Figure 5:
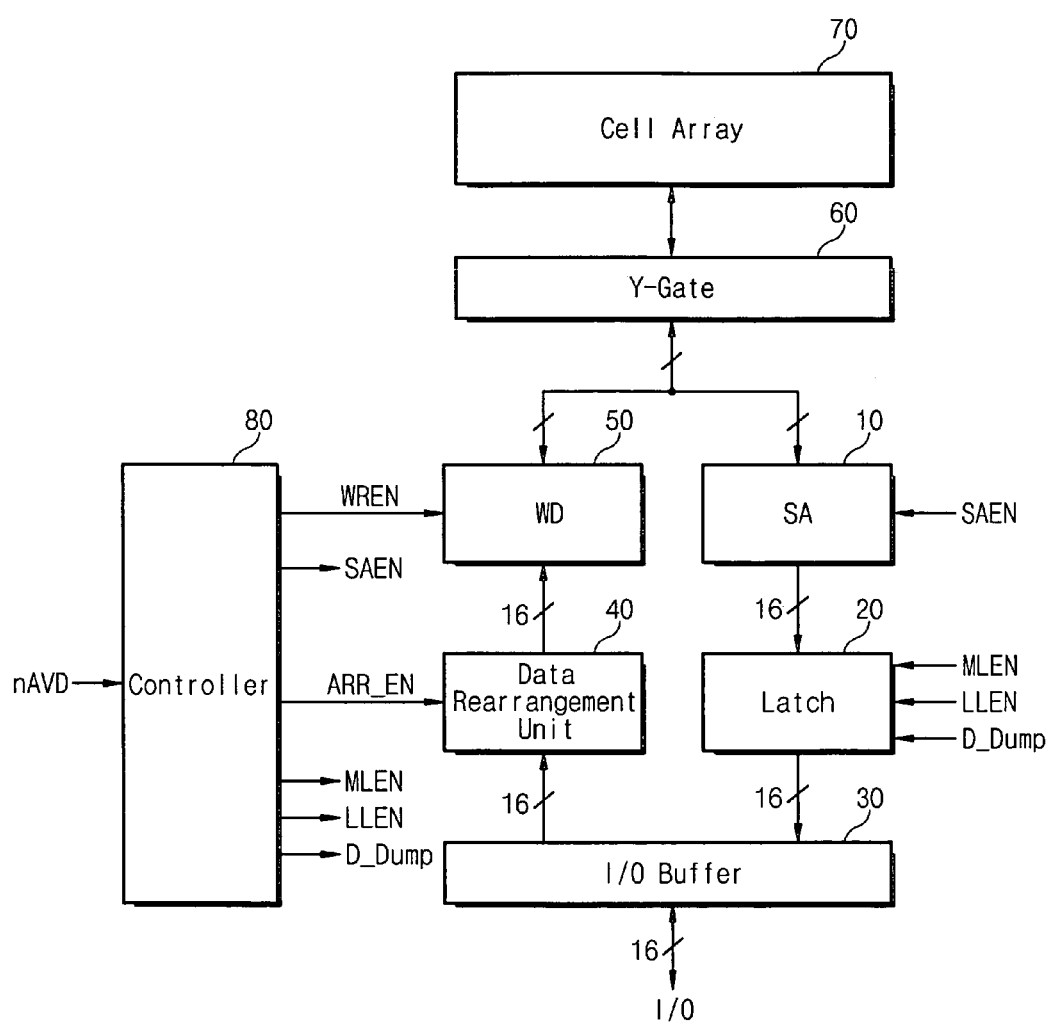
FIG. 5 is a block diagram of a burst access according to an embodiment.

FIG. 5 is a block diagram of a flash memory device according to an embodiment. Referring to FIG. 5, a control unit 80 controls data program and read operations. A data rearrangement unit 40 rearranges input data so as to program them according to the program method of this embodiment.

A write driver 50 activates bit lines so as to program the rearranged data. A Y-gate 60 selects the bit lines according to an input address. A cell array 70 includes multi level cells (MLCs), and a sense amplifier 10 senses selected cells. A latch circuit 20 latches the sensed result, and an I/O buffer 30 temporarily stores I/O data. Through the above structure, the flash memory can operate at a high read speed by reducing an initial latency (the time until data are outputted from an input of command in a burst mode). The same reference numerals or symbols are used to refer to the same elements throughout the drawings.

The data rearrangement unit reconfigures two or more input word-unit data and rearranges them such that one word is assigned to different physical addresses. In the embodiments in which 2-bit data per cell is programmed, if the data corresponding to one designated burst length is inputted, the data is divided into two equal parts in units of words. The data are rearranged such that one part of the divided data bits is programmed in MSBs of cells and the other part is programmed in LSBs of the cells. A detailed operation of the data rearrangement unit 40 will be described later with reference to FIG. 6.

The write driver 50 activates bit lines of cells to be programmed in response to a write enable signal WREN so as to allow the reconfigured data to be programmed in the cell array 70 operating as MLCs.

The Y-gate 60 is a circuit for selecting cells corresponding to the input addresses. In the program or read operation, the Y-gate 60 selects bit lines of cells such that they are connected to the write driver 50 or the sense amplifier 10.

The cell array 70 includes flash memory cells operating as MLCs that can store 2 bits or more per cell. The memory cells according to this embodiment are configured with NOR memory cells operating as 1 cell/2 bits, in which one MSB and LSB per cell are programmed.

The sense amplifier 10 is coupled to the bit lines of the respective cells such that it corresponds to the cells in which one burst mode data are stored, and detects threshold voltages of the cells in response to the activation signal SAEN. The programmed data are sensed through the serial sensing, including the first sensing for sensing the MSB and the second sensing for sensing the LSB. Each sensing is performed for two clocks and thus, four clocks are necessary for sensing both the MSB and the LSB.

The latch circuit 20 temporarily stores the detected data outputted through the serial sensing of the sense amplifier 10. Specifically, the MSB values of the respective cells outputted through the first sensing are stored in the MSB latches allocated in each cell in response to the MLEN signal. Then, if the LSB data of the cells sensed by the sense amplifier 10 through the second sensing are outputted, the LSB data are stored in the LSB latches allocated in each cell in response to the LLEN signal. If all latches are filled through the serial sensing, it means that all data of one burst length are stored in the corresponding latches. However, according to the programming method of the data rearrangement unit 40, the MSB data latched through the first sensing can be combined in words of the earlier part of the burst length. Accordingly, even when the LSB data are not latched, the words of the earlier part of one burst length can be outputted. In addition, even when only the latched LSB data are combined, they can be combined in a series of words corresponding to the latter part of the input data prior to the rearrangement. Accordingly, the latch circuit can be configured in units of words that can be outputted after the first sensing. After first sensing, half of the burst length is outputted by combining the latched LSB data simultaneously with the second sensing. After the second sensing, the LSB data can be combined and outputted as the word-unit data. The D_Dump signal allows the outputs of the MSB latches to be outputted in units of words by controlling the outputs of the MSB latches at the same time with the second sensing after the first sensing is completed. At the same time with the completion of the second sensing, all data corresponding to the latter part of the unit burst length are combined in units of words by the D_Dump signal and then are outputted. Therefore, the designated burst mode output is completed. The latch will be described later in detail with reference to FIG. 8.

The I/O buffer 30 outputs the word-unit data from the latch circuit 20 to the outside in synchronization with the clock.

Figure 6:
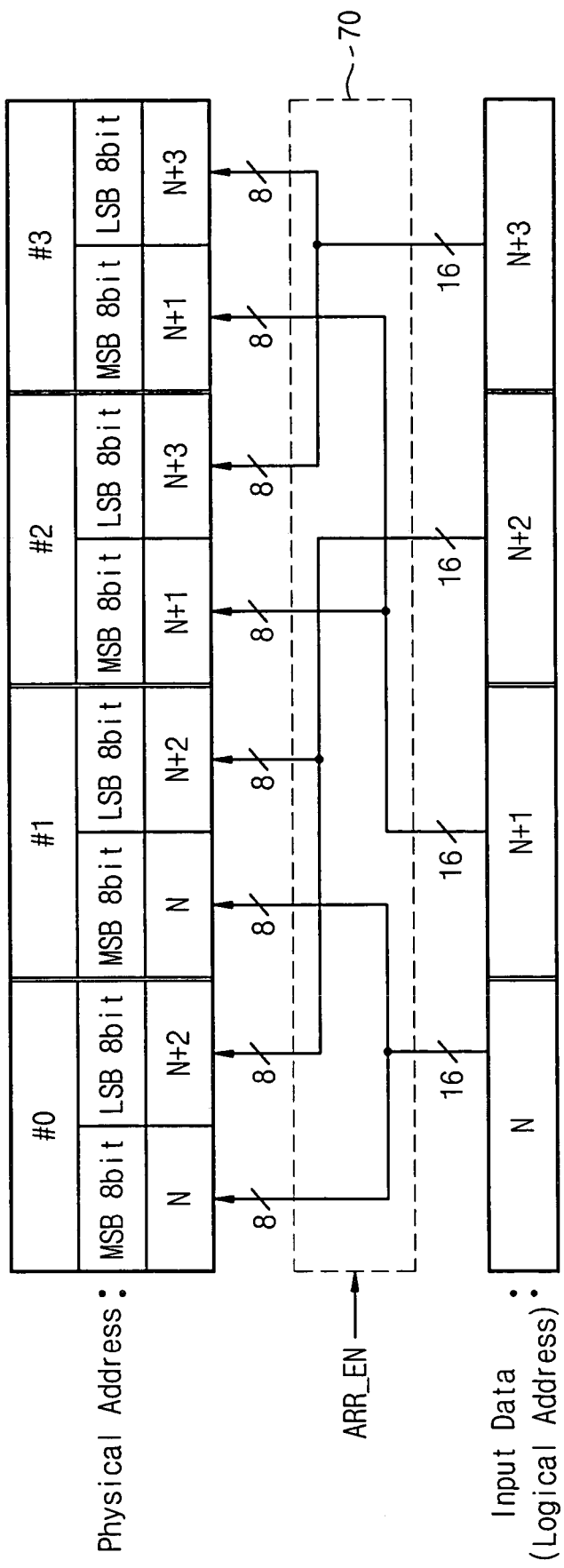
FIG. 6 is a diagram illustrating a method of programming data according to an embodiment.

FIG. 6 is a block diagram illustrating an operation of the data rearrangement unit 40 of FIG. 5 for the implementation of the reading method according to an embodiment. Referring to FIG. 6, four consecutively inputted word data corresponding to one designated burst length is divided into two parts. That is, the earlier-part word N and N+1, and the latter-part word N+2 and N+3. In response to the rearrangement activation signal ARR_EN, the data rearrangement unit 40 arranges the respective bits of the earlier-part word such that they are programmed in MSBs of all target cells. More specifically, at least two word data are divided into two parts, and the word data to be outputted to the earlier part are arranged such that they are programmed in the MSBs of all cells. The word data to be outputted to the latter part are arranged such that they are programmed in the LSBs of all cells. Although the burst length is 4 in the above embodiments, other embodiments can be applied to all burst modes having the burst length of more than two.

FIG. 7 is a memory map for explaining the programmed result when four word data N, N+1, N+2 and N+3 are programmed in the memory cell array of unit block having four physical addresses #0, #1, #2 and #3. According to the prior art, one word including the MSB and the LSB is programmed in the memory cells corresponding to one physical address. According to this embodiment as shown in FIG. 7, however, data bits of the word N of one unit burst length are programmed in the MSBs of the cells corresponding to the physical addresses #0 and #1. Similarly, the data bits of the word N+1 are programmed in the MSBs of the cells corresponding to the physical addresses #2 and #3, respectively. The words N+2 and N+3 corresponding to the latter part of the unit burst length are programmed in the LSBs corresponding to the physical addresses #0 and #1 and the LSBs corresponding to the physical addresses #2 and #3 respectively.

Explaining the programming method in brief, the earlier part among the words of the burst unit is programmed in the MSBs of the cells, and the latter part is programmed in the LSBs of the cells.

Figure 8:
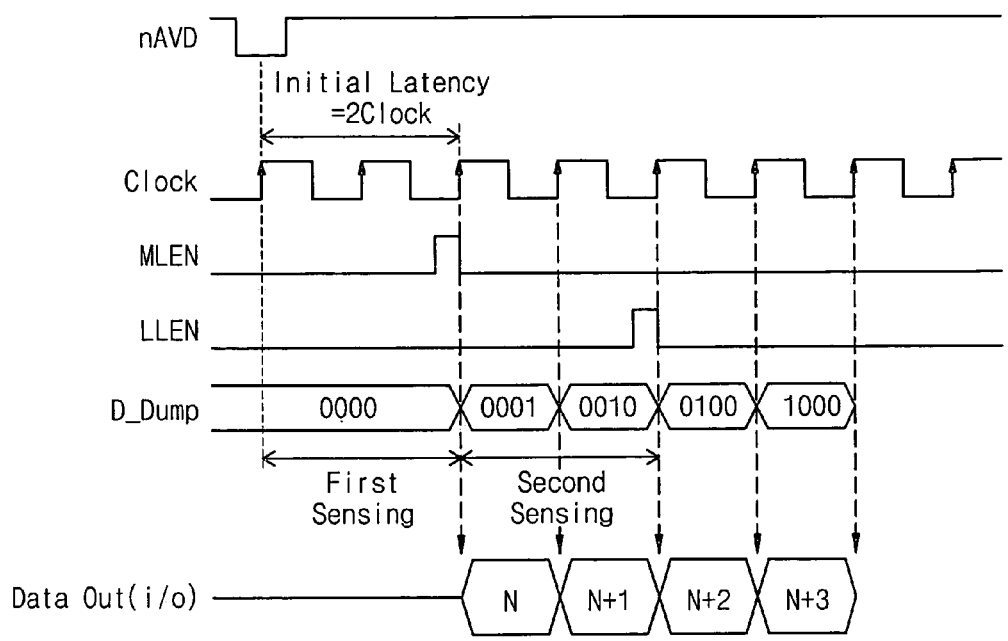
FIG. 8 is a timing diagram of a burst reading according to an embodiment.

FIG. 8 is a timing diagram illustrating the operation of when the data of the cell array, programmed by the above-described programming method, are accessed in the burst mode by the reading method according to an embodiment. Referring to FIG. 8, when an address detection signal nAVD is inputted, indicating that the input address is valid, the MSB data of the cells are detected by the sense amplifiers 10 during the first sensing period of two clocks. At the latter part of the first sensing, when the MLEN signal is inputted such that the detected MSB data can be stored in the corresponding MSB latch, the data are prefetched by the sense amplifiers and then are latched. However, since the data detected during the first sensing are MSB bits of all cells, the bit data are bit values of the words N and N+1. Accordingly, if the MSB bits are detected, the words corresponding to the earlier part of the designated burst length can be latched by a combination of the latches. This result implies that the data output in the burst mode need not wait until all bits are latched. That is, after the first sensing, the bits corresponding to the latched words N and N+1 can be combined and outputted at the same time with the second sensing. During the second sensing period, the bits corresponding to the words N+2 and N+3 programmed in the LSBs of the target cells are prefetched by the sense amplifier in synchronization with the LLEN signal, and are stored in the latches. Just after the second sensing is completed, the words of the latched LSB data N+2 and N+3 are outputted in response to the D_Dump signal. Here, the D_Dump signal "0001" controls the latch circuit 20 to activate the outputs of the latches in which the bits contained in the word N are programmed, and the D_Dump signal "0010" controls the latch circuit 20 to activate the outputs of the latches in which the bits corresponding the word N+1 are programmed. The D_Dump signal "0100" controls the latch circuit 20 to activate the outputs of the latches in which the bits corresponding to the word N+2 are programmed, and the D_Dump signal "1000" controls the latch circuit 20 to activate the outputs of the latches in which the bits corresponding the word N+3 are programmed. As a result, the above operations mean that data output for the burst reading starts together with the second sensing, so that the initial latency can be reduced. In this embodiment, the initial latency is reduced by two clocks compared with the prior art. If the burst length is 2 (BL=2), data corresponding to one burst length can be completely outputted after three clocks.

The burst access operation according to an embodiment is divided depending on the output order of the burst unit data. Then, the data to be outputted to the earlier part are programmed in the MSBs of the selected cells, and the data to be outputted to the latter part are programmed in the LSBs of the selected cells. During the first sensing, the earlier-part words of the burst unit can be configured only by detecting and latching the MSBs of the cells. Therefore, during the second sensing that senses the LSB bits, the bits programmed in the MSBs can be combined and outputted. When the second sensing is completed, the latter-part words can be combined and outputted as one burst unit by combining the bits programmed in the LSBs.

Although the synchronous flash memory in the above embodiments has 16 bits/1 word and the burst length of 4 (BL=4), other embodiments are not limited this configuration and can be applied to the various burst lengths and word lengths.

As described above, the synchronous flash memory supporting the MLCs and the burst mode can combine words of I/O units without latching all data of one burst unit.

As described above, a multilevel memory cell may include a most significant bit and a least significant bit to be sensed sequentially. However, the number of bits sensed in one sensing operation is not limited to one. For example, if a multi level memory cell is capable of storing four bits, a first set of bits, including the two most significant bits, may be sensed at one time and a second set of bits, including the two least significant bits, may be sensed at a subsequent time. Thus the multi level memory cell may have sets of multiple bits where each set is to be sensed sequentially. Furthermore, the number of sets is not limited to two and the number of bits in a set may be one. For example, if a multi level memory cell is capable of storing four bits, each bit may be sensed sequentially. Thus, each bit will form a set, resulting in four sets of bits for the multi level memory cell.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A semiconductor memory device comprising:
a plurality of memory cells, each memory cell configured to store a plurality of bits;
a sensing circuit configured to sequentially sense, for each memory cell, a plurality of sets of the bits of the memory cell;
a data rearrangement unit configured to receive a plurality of words of data and to rearrange bits of the words to be stored in the memory cells; and
an output circuit configured to output a group of the words using the sets of bits from one sensing, at least as early as during a subsequent sensing of sets of bits.

2. The semiconductor memory device of claim 1, wherein the data rearrangement unit is further configured to rearrange the bits of the words such that each word is to be stored in sets of the bits of the memory cells to be sensed simultaneously.

3. The semiconductor memory device of claim 1, wherein the output circuit further comprises a latch configured to latch the words of data and to sequentially output the groups of the words such that each group is output before any subsequent group is latched.

4. The semiconductor memory device of claim 1, wherein:
the plurality of the words further comprises a first set of words and a second set of words; and
the data rearrangement unit is further configured to rearrange the bits of the words such that the first set of words is rearranged to be stored in most significant bits of the memory cells and the second set of words is rearranged to be stored in least significant bits of the memory cells.

5. The semiconductor memory device of claim 4, wherein the output circuit is further configured to sequentially output the first set of words and the second set of words.

6. The semiconductor memory device of claim 1, wherein the plurality of words further comprise a burst length of words.

7. The semiconductor memory device of claim 6, wherein the data rearrangement unit is further configured to rearrange the burst length such that a first half of the burst length is rearranged to be stored in most significant bits of the memory cells and a second half of the burst length is rearranged to be stored in least significant bits of the memory cells.

8. The semiconductor memory device of claim 1, wherein the data rearrangement unit further comprises a plurality of switches configured to change the path of the bits through the data rearrangement unit in response to a rearrangement signal.

9. The semiconductor memory device of claim 1, wherein the flash memory device is a NOR flash memory device.

* * * * *